United States Patent
Mazzochette

(10) Patent No.: US 8,087,798 B2
(45) Date of Patent: Jan. 3, 2012

(54) LIGHT SOURCE WITH OPTIMIZED ELECTRICAL, OPTICAL, AND ECONOMICAL PERFORMANCE

(75) Inventor: Joseph B. Mazzochette, Cherry Hill, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 234 days.

(21) Appl. No.: 11/937,638

(22) Filed: Nov. 9, 2007

(65) Prior Publication Data

US 2009/0121656 A1    May 14, 2009

(51) Int. Cl.
*F21V 9/00*    (2006.01)
(52) U.S. Cl. ......... 362/231; 362/234; 362/800; 324/414
(58) Field of Classification Search ............... 362/227, 362/228, 231, 234, 555, 612, 800; 315/185 R, 315/192, 312; 716/4; 324/403, 414
See application file for complete search history.

(56) References Cited

U.S. PATENT DOCUMENTS

| | | | |
|---|---|---|---|
| 6,650,064 B2 * | 11/2003 | Guthrie et al. | 315/185 R |
| 6,683,423 B2 * | 1/2004 | Cunningham | 315/312 |
| 6,921,182 B2 * | 7/2005 | Anderson et al. | 362/231 |
| 7,023,543 B2 * | 4/2006 | Cunningham | 356/300 |
| 2004/0218387 A1 * | 11/2004 | Gerlach | 362/231 |
| 2005/0281027 A1 * | 12/2005 | Capen et al. | 362/231 |
| 2006/0018118 A1 * | 1/2006 | Lee et al. | 362/231 |
| 2009/0114932 A1 * | 5/2009 | Chou | 257/89 |

* cited by examiner

Primary Examiner — Thuy Vinh Tran
(74) Attorney, Agent, or Firm — Cantor Colburn LLP

(57) ABSTRACT

An optimized light source and a method of manufacturing the same. The light source is made up of an array of individual lighting elements and is optimized for electrical, optical and economic performance, as well as a method for configuring such an array. The a process for selecting individual lighting elements is based on characterizing and sorting individual lighting elements based on performance so that the performance of the overall array is improved by combing individual lighting elements whose individual performance might not otherwise meet the performance of the overall array.

11 Claims, 6 Drawing Sheets

| Type | Average | Standard Deviation | Maximum | Minimum |
|---|---|---|---|---|
| Tradtional/Random Selection | 5.00 | 2.14 | 10.00 | 0.50 |
| Selected from 2 Ranges - Upper and Lower | 4.96 | 1.21 | 7.50 | 2.50 |

Figure 6

|  | FV1 | FV2 |
|---|---|---|
| DM1 | 710 | 720 |
| DM2 | 730 | 740 |

LIGHT SOURCE WITH OPTIMIZED ELECTRICAL, OPTICAL, AND ECONOMICAL PERFORMANCE

FIELD OF THE INVENTION

The present invention generally relates to lighting equipment. More specifically, the present invention relates to a method and system for efficient and optimized configuration of lighting systems.

BACKGROUND OF THE INVENTION

Solid state lights are increasingly replacing traditional incandescent and fluorescent lamps in many applications. Solid state lights have many advantages over incandescent and fluorescent lighting. Solid state sources generally last five to ten times longer, consume approximately 25% of the energy, are associated with lower fire risks due to lower operating temperatures, and are more durable and rugged than their incandescent and fluorescent counterparts.

Many solid state light designs are such that the illumination source is made up of an array of individual lighting elements. These lighting elements may be light emitting diodes ("LEDs"), lasers, laser diodes or other monochromatic or poly-chromatic sources. In applications where LEDs are used, they are typically selected from large batches of production LED dies. The fabrication process of LED dies results in variations in the LEDs' performance in various parameters. Accordingly, the LED dies typically undergo testing before they are used in the manufacture of solid state lights.

The testing of the LED dies typically results in a normal distribution. For example, testing of a production batch of LED dies for dominant wavelength performance generally yields a normal distribution, with 95% of the parts being within a 10 nm range. However, although the LED dies are generally tested for their individual performance against established specifications, the performance of each LED die is typically not compared relative to the performance of the other LED dies in the production batch, except for purposes of statistical analysis. Each LED die is tested against a specification, and determined to either pass or fail. After testing of the LED dies is complete, traditionally, passing LED dies are selected randomly in the manufacture of LED arrays.

Some parameters that may be tested to characterize an LED's performance may include, but are not limited to, dominant wavelength ("DW"), peak wavelength ("PW"), forward voltage ("$V_f$"), uniform light output, total luminous flux ("TLF"), and light color rendering index ("CRI"). Dominant wavelength is defined as the wavelength of a monochromatic stimulus that, when additively mixed in suitable proportions with the specified achromatic stimulus, matches the color stimulus considered. In other words, the DW is the single wavelength of color that is perceived from a polychromatic light source. Peak wavelength is the single wavelength at which the radiant intensity of the light source is at its maximum. Forward voltage is the voltage drop across a forward biased LED. Uniform light output is a measure of the quality of the light by measuring the uniformity of power emitted by a light source across all possible viewing angles. Total luminous flux is the human-eye-weighted sum of power emitted by a light source in the band of visible wavelengths of light. Color rendering index is another measure of the quality of a light source by measuring the proportions of all the wavelengths of visible light present in the light emitted by the source.

SUMMARY OF THE INVENTION

The present invention is directed to an optimized solid state light source that is made up of an array of individual lighting elements, as well as a method for configuring such an array. Since many applications of LEDs in solid state lights utilize LED arrays rather than individual LEDs as illumination sources, LEDs can be selected in a manner to optimize the performance of the LED array and the yield of an LED production batch. LEDs having complementary performance characteristics can be specifically selected to populate a single array, resulting in improved performance of the LED array, and allowing individual LEDs that may have failed traditional testing to be utilized. This may result in optimized performance and higher utilization yields, lowering overall production costs.

A first aspect of the present invention is a method for selecting individual lighting elements in the manufacturing of a solid state light that utilizes an array of individual lighting elements as the illumination source. The method optimizes the performance of the overall array. A second aspect of the invention is the apparatus of the optimized solid state light source that results from the method of the present invention. Although the teachings of the present invention may be described with respect to certain designs of solid state lights and various parameters characterizing LEDs, these are merely exemplary embodiments and the teachings of the present invention may be applied to nearly all solid state lights utilizing LED arrays as illumination sources and any performance parameter desired.

A first aspect of the present invention is a method of selecting individual LED dies from a production batch to make up an LED array for a solid state light. The selection of the LED dies is based on performance measurements of various parameters that characterize the performance of the individual LED dies. After the design of the LED array is identified, a determination is made as to which parameter is to be optimized for a given application. Next, performance measurements of the selected parameter may be collected and recorded for each LED die in the production batch. After measurements for all the LED dies have been obtained, the LED dies may be sorted according to their performance for the selected parameter. After the LED dies have been sorted, depending on the design of the LED array to be manufactured and the number of LED dies to be used in the array, the LED dies may be specifically matched with other LED dies according to their measured performance for the chosen parameter. The matching of the LED dies may be made in a manner so that the combination of the matched LED dies may result in an LED array with improved performance for the specified parameter. Furthermore, in some applications, the matching of the LED dies for each LED array may result in higher yields. Lastly, the matched LED dies may be manufactured into a single LED array to be used in the manufacture of a solid state light, where the performance of the matched LED dies in the LED array is optimized for the specified parameter.

Another aspect of the present invention is the actual LED light that is manufactured using the method of the present invention. The method can be employed to yield solid state lamps that are optimized to achieve a desired performance for any parameter. Furthermore, since it is much easier to manipulate combinations of LED dies rather than the fabrication of LED dies, tighter control of the specifications for the LED array may be possible at significant cost savings.

As previously noted, the steps of this method may be used where the selection of LED dies is based on virtually any parameter, and any LED array design. Accordingly, the teachings of the present invention may be used in the manufacture of nearly all solid state LED lights designed with an LED array. Some parameters that may be used in the implementation of the present invention include, but are not limited to, forward voltage, dominant wavelength, peak wavelength, uniform light output, total luminous flux, uniform light output and color rendering index.

BRIEF DESCRIPTION OF THE DRAWINGS

The present invention will be more readily understood from the detailed description of exemplary embodiments presented below considered in conjunction with the accompanying drawings, in which:

FIG. 6 is a chart comparing selected statistical values of the distributions depicted in FIGS. 4 and 5;

FIG. 7 is a chart showing an exemplary performance matrix that may be used in the grouping of LEDs when more than one parameter is selected to be optimized.

DETAILED DESCRIPTION OF THE INVENTION

The present invention is directed to a method for selecting individual lighting elements from a large population in order to populate an array of lighting elements which may be used in the manufacture of a light source. The present invention is also directed to the manufactured light source resulting from the method taught by the present invention.

Figure 1:
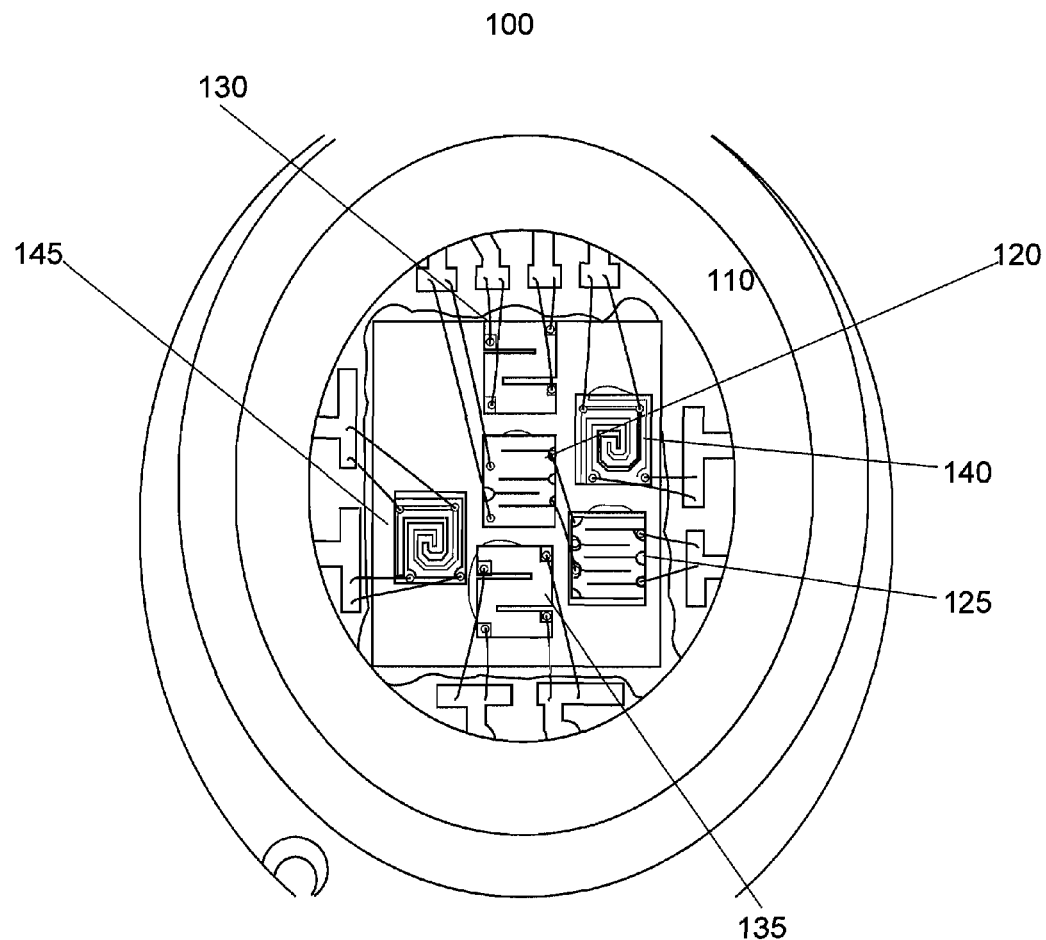
FIG. 1 is an exemplary embodiment of a solid state light that utilizes an LED array as an illumination source.

FIG. 1 is an exemplary embodiment of a solid state light 100 according to the present invention. The light 100 may be manufactured with LEDs according to the method taught in the present invention. The light 100 may include an LED array 110, which may be made up of individual LEDs, 120, 125, 130, 135, 140 and 145. The LED array 110 may be optimized according to the present invention in a manner where the LEDs are selected so that the LED array 110 performs optimally for a selected parameter(s). Depending on the application of the light 100, the LEDs used to make up the LED array 110 may be of different colors. In one embodiment, the LEDs 120 and 125 may be green LEDs, the LEDs 130 and 135 may be blue LEDs, and the LEDs 140 and 145 may be red LEDs. This is only one embodiment of the light 100, and the LED array 110 may be made up of any number of LEDs, and of various colors.

Figure 2:
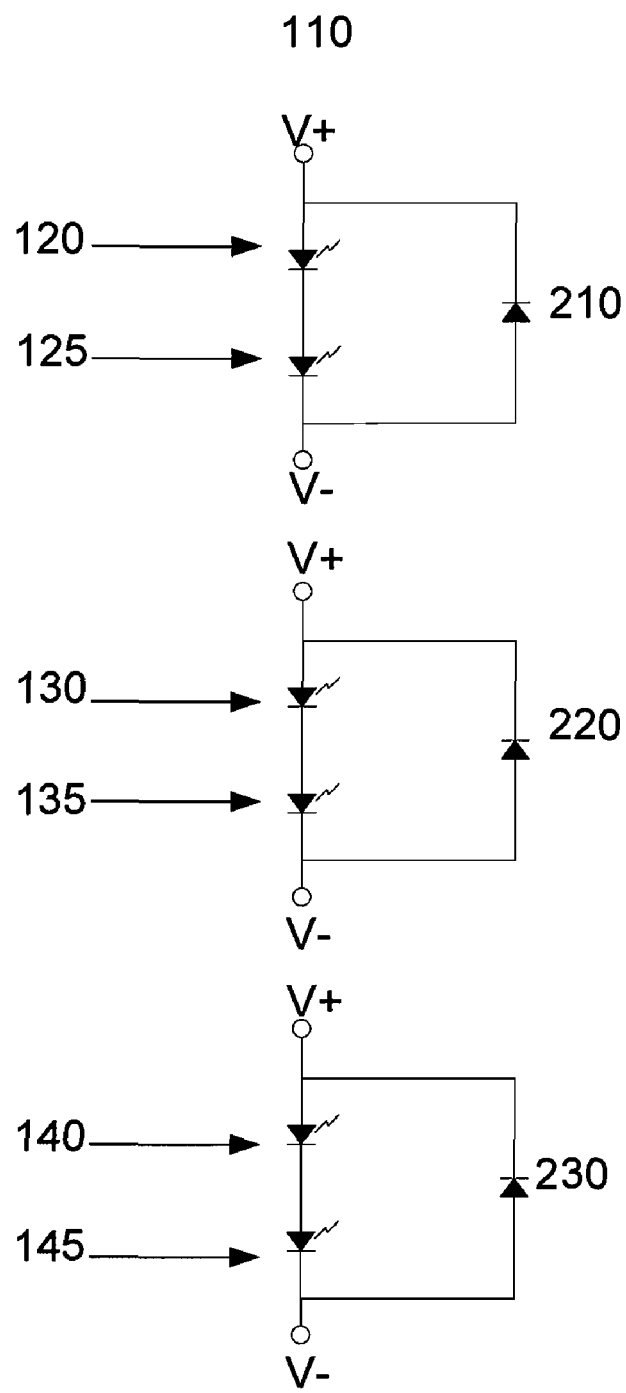
FIG. 2 is a schematic representation of the LED arrays shown in the solid state light of FIG. 1.

FIG. 2 is a schematic representation of the LED array 110 illustrated in FIG. 1. FIG. 2 shows the LEDs 120, 125, 130, 135, 140 and 145 that make up the LED array 110, and may be selected according to the teachings of the present invention. The diodes 210, 220 and 230 may be incorporated into the design of the circuit to protect the circuit from electrostatic discharge ("ESD").

Figure 3:
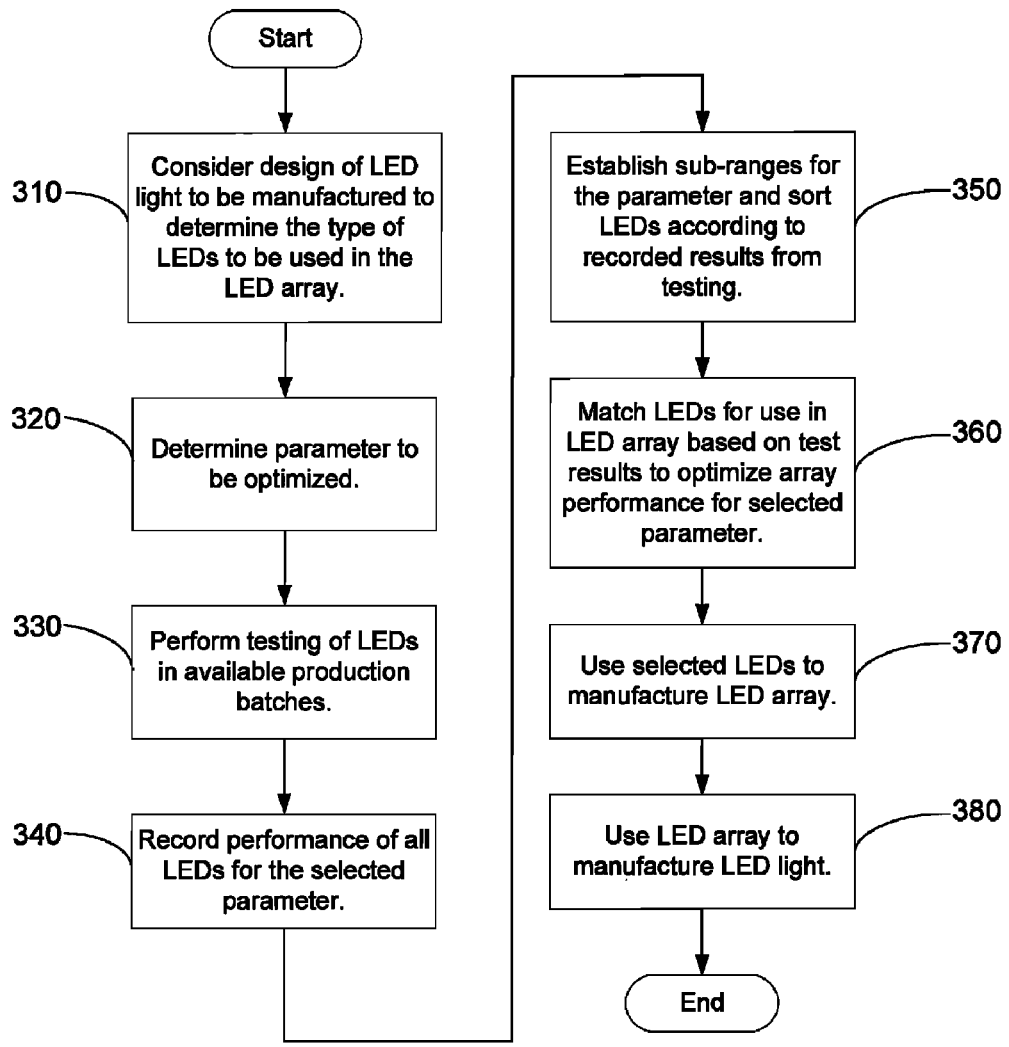
FIG. 3 is a general exemplary flow diagram of a method of selecting LEDs according to the present invention.

FIG. 3 is a general exemplary flow diagram of a method 300 according to the present invention that may be used to select LEDs in the manufacturing process of the solid state light 100. The steps of the method 300 will be described with reference to the elements and features of the solid state light 100 depicted in FIG. 1. However, the steps of the method 300 are not confined to the manufacture of the solid state light 100, and may be used in the manufacture of nearly all lights that include an array of individual light elements. The first step of the method 300 is step 310, where the design of an LED light to be manufactured is identified. Step 310 may include considerations such as the number, type and color of LEDs that will be used to make up the LED array 110.

After the designs of the light 100 and the LED array 110 are determined during the step 310, at least one parameter to be optimized is identified in step 320. Parameters that may be selected may include forward voltage, dominant wavelength, peak wavelength, uniform light output, total luminous flux and color rendering index. The parameter(s) chosen may be based on considerations by the manufacturer of the LED array 110, such as the final use and application of the LED array 110, and may be different depending on what the manufacturer decides is important for its LED array 110.

During steps 330 and 340, LED dies in a production batch available for the manufacture of the LED array 110 may be tested and the results of the testing may be recorded. Although the parameter(s) selected to be optimized during the step 320 may be important, it may not be the only performance test that is performed on the LED dies in the production batch. The LED dies in a production batch may undergo testing for several of the parameters mentioned above, in addition to other characteristics.

After the LED dies are tested in step 330, the LED dies may be sorted into groups during step 350 according to the parameter(s) selected in step 320. This may be performed if only one parameter is chosen, or it may be performed if two or more parameters are chosen. The sorting of the LED dies may include dividing the range of measured values for the selected parameter into smaller sub-ranges. The sub-ranges used for the sorting of the LED dies may be as precise or coarse as desired, and may also be dictated by the parameter(s) selected in step 320.

After the LED dies have been sorted according to the selected parameter(s), during step 360, the sorted LED dies may be specifically matched with other LED dies according to their measured parameter performance. The matching process may include matching LED dies from one group with LED dies from another group so that when combined to make up the LED array 110, the parameter performance of the assembled LED array 110 is optimized. This matching process may be performed by matching LED dies grouped in an upper sub-range of the normal distribution with LED dies grouped in a lower sub-range of the normal distribution. Alternatively, the matching process may ensure that the LED array 110 has an even distribution of LED dies from all sub-ranges or groups. The matching process performed during step 360 may vary depending on the parameter(s) selected to be optimized. The matching process may also depend on the number of LED dies that are to be used in the LED array 110, and the color of LED dies to be used in the LED array 110. Additionally, the matching step 360 may allow LED dies that traditionally may have been discarded to be used, e.g., when matched with LED dies having complementary performance for a particular parameter. The selected sub-ranges may be chosen in a manner that maximizes the number of LED dies that are used from a given a production, optimizing the yield.

The matched LED dies may then be used to produce the LED array 110 during step 370. When the matching process of step 360 is performed, the LED array 110 will have improved performance for the selected parameter(s), and fewer LED dies from a production batch will have to be discarded, resulting in a higher yield. The LED array 110 produced in step 370 may then be used to manufacture the light 100 in step 380.

Example 1

In a first embodiment, the light 100 may be a light source with optimized electrical, optical and economic performance with respect to the dominant wavelength parameter according to the present invention. The design of the light 100 may be identified during step 310 of the method 300, and may include the LED array 110. The LED array 110 in turn may include green LEDs (120, 125), blue LEDs (130, 135) and red LEDs (140, 145). Although the LED array 110 may be made up of any number of LEDs of any color, for ease of illustration in this example, it will be assumed that the LED array 110 is made up of only two LEDs.

During step 320 of the method 300, dominant wavelength is selected as the parameter to optimize. After dominant wavelength has been selected in step 320, the LED dies are tested in step 330. During the testing of the LED dies in step 330, the values of the dominant wavelength are recorded for all the tested LED dies as described in step 340 of method 300.

Figure 4:
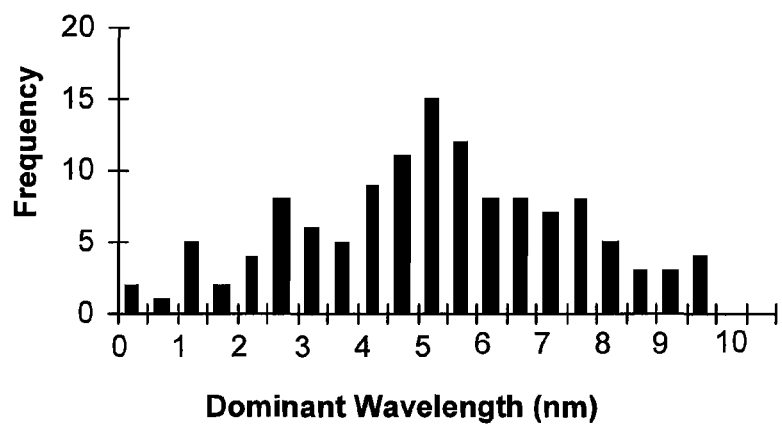
FIG. 4 is a chart showing an exemplary normal distribution of the dominant wavelength performance of LED arrays manufactured by a traditional process of randomly selecting LED dies from a production batch.
Figure 5:
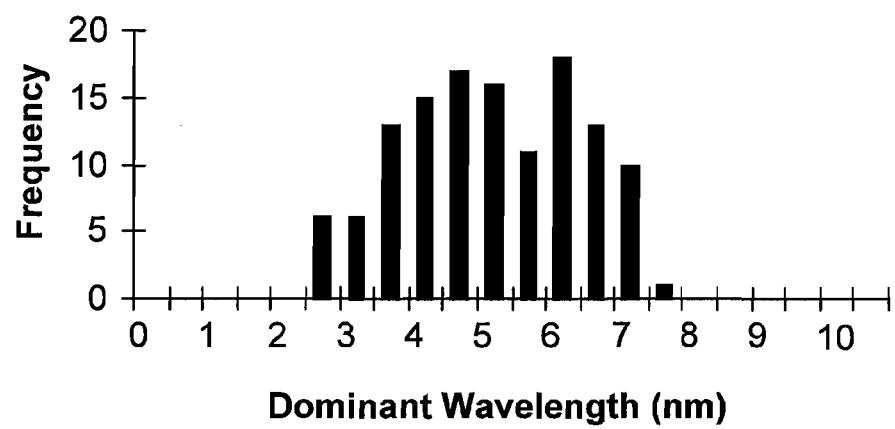
FIG. 5 is a chart showing an exemplary normal distribution of the dominant wavelength performance of LED arrays manufactured according to the LED die matching process taught by the present invention.

After these test results are obtained, the matching step 360 may be as simple as dividing the LED dies into two sub-ranges, and selecting one LED die from each of the two sub-ranges to make up the LED array 110. In the exemplary embodiment, if the range of the resulting normal distribution is 10 nm, the two sub-ranges may be an upper and lower band, with each band being 5 nm wide. The process of matching the LED dies includes selecting one LED die from the lower 5 nm sub-range, and a second LED die from the upper 5 nm sub-range. FIG. 4 shows the resulting dominant wavelength performance distribution of a 2-LED array with the same design as the LED array 110, but manufactured according to traditional methods of randomly selecting LEDs from passing components. FIG. 5 shows the distribution of the dominant wavelength performance of the LED arrays 110 manufactured according to the method of the present invention.

FIG. 6 is a table comparing relevant statistical data from the charts illustrated in FIGS. 4 and 5, quantifying the performance improvements realized by implementing the method according to the present invention. First, the standard deviation of the LED arrays manufactured according to the present invention (1.21 nm) is approximately 43% smaller than the standard deviation associated with the distribution of LED arrays manufactured according to traditional methods (2.14 nm). This indicates that the performance of the LED arrays exhibits a much tighter distribution around the desired dominant wavelength for the LED arrays manufactured according to the present invention. Second, the overall range of the dominant wavelength performance of the LED arrays manufactured according to the present invention (5 nm) is considerable smaller than the range of the LED arrays manufactured according to traditional methods (9.5 nm).

If even greater precision is desired, the matching step 360 may be modified so that more than two sub-ranges are utilized. In the exemplary embodiment, instead of establishing only an upper and a lower sub-range, the range of the normal distribution of dominant wavelength performance may be broken up into four sub-ranges. Sub-Range 1 may be 0-2.5 nm, Sub-Range 2 may be 2.5-5 nm, Sub-Range 3 may be 5-7.5 nm and Sub-Range 4 may be 7.5-10 nm. Accordingly, LED dies from Sub-Range 1 and Sub-Range 4 may be matched, and LED dies from Sub-Range 2 may be matched with LED dies from Sub-Range 3. This results in a further improvement of dominant wavelength performance.

In an alternative embodiment, peak wavelength may be selected as the parameter to be optimized. The method for optimizing the LED array 110 for peak wavelength performance is similar to that described with respect to dominant wavelength, except the testing, recording, and matching are performed with respect to peak wavelength measurements.

In yet another alternative embodiment, forward voltage may be selected as the parameter to be optimized. The method for optimizing the LED array 110 for forward voltage performance is similar to that described with respect to dominant wavelength, except the testing, recording, and matching are performed with respect to forward voltage measurements.

In yet another alternative embodiment, total luminous flux may be selected as the parameter to be optimized. The method for optimizing the LED array 110 for total luminous flux performance is similar to that described with respect to dominant wavelength, except the testing, recording, and matching are performed with respect to total luminous flux measurements.

In yet another alternative embodiment, the color rendering index ("CRI") may be selected as the parameter to be optimized. For CRI, since the presence of all wavelengths of visible light in a given source results in the highest score, the method is slightly different. Unlike the previously noted embodiment of optimizing the dominant wavelength by matching complementary LED dies, in selecting LED dies for an LED array 110 according to an embodiment to optimize the CRI value of the light, the LED dies are selected from the dominant wavelength distribution so that an even distribution of the wavelengths present in the production batch is included in the LED array 110. This allows for the presence of as many wavelengths as possible in the LED array 110, resulting in an optimized CRI measure.

In yet another alternative embodiment, the uniform light output may be selected as the parameter to be optimized. The method for optimizing the LED array 110 for uniform light output performance is similar to that described with respect to CRI, except the testing, recording, and matching are performed utilizing total luminous flux measurements instead of dominant wavelength.

In yet another alternative embodiment, more than one parameter may be selected to be optimized. Although optimizing more than one parameter is more involved, the substantive steps of the method according to the present invention remain the same. FIG. 7 shows a performance matrix that may be used in an embodiment where dominant wavelength and forward voltage are selected to be optimized. After all LED dies are tested for all the selected parameters, each parameter may be divided into sub-ranges based on performance. In the exemplary embodiment, each parameter is divided into two sub-ranges: dominant wavelength performance is divided into sub-ranges DW1 and DW2; and forward voltage performance is divided into sub-ranges FV1 and FV2. The LED dies are then sorted according to their performance for all the selected parameters. In this embodiment, the LED dies are sorted into four groups (710, 720, 730, 740). After the sorting has been completed, the LED dies are matched according to the recorded performance in the selected parameters. In the present embodiment, LED dies from group 710 are matched with LED dies from group 740, and LED dies from group 720 are matched with LED dies from group 730. The performance of the LED array 110 resulting from this embodiment is optimized for both forward voltage and dominant wavelength.

Example 2

Figure 8:
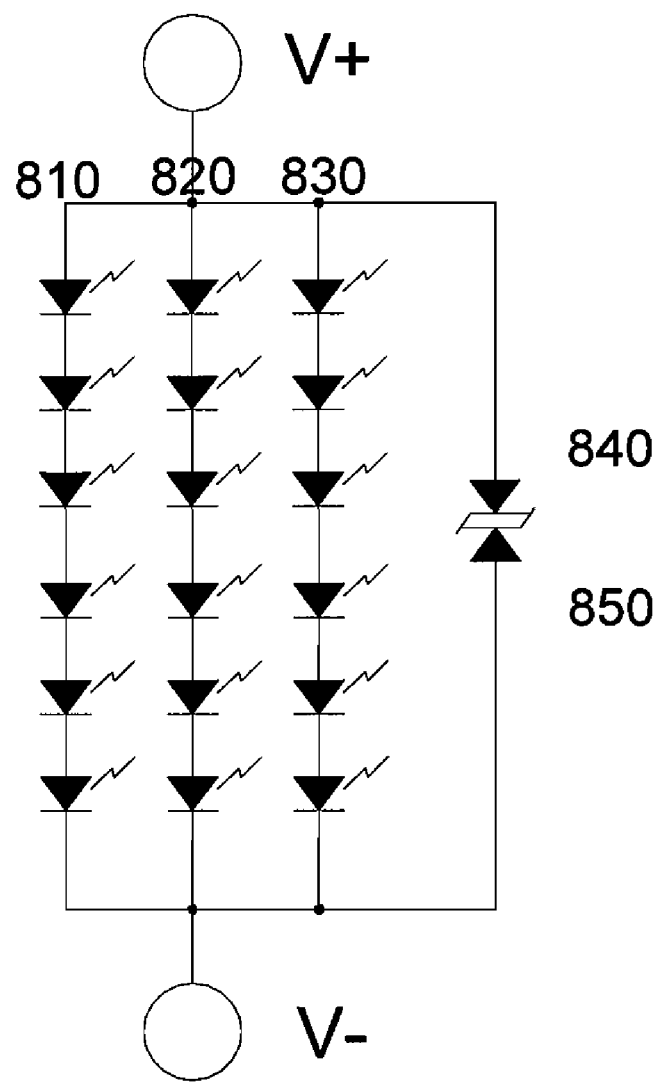
FIG. 8 is a schematic representation of an alternative design of an LED array that may be used in a solid state light.

In another embodiment of the present invention, an LED light may include LED array 800 as illustrated in FIG. 8. The LED array 800 includes three strings (810, 820, 830) of six LEDs each. Back-to-back Zener diodes 840 and 850 may be incorporated in the design of the circuit to provide ESD protection for the circuit. For LED array designs that incorporate long strings of LEDs, such as the one illustrated in FIG. 8, it is important that the current flowing through each of the strings is balanced. Unbalanced current through each of the stings may result in improper operation, or premature damage to the circuit and/or failure. Traditionally, to ensure balanced current through each of the strings, the production LED dies are tested for forward voltage against a narrow specification range. This generally leads to many failing LED dies, resulting in low yields. This yield may be substantially increased if the LED array 800 is manufactured according to the teachings of the present invention.

According to the present invention, during steps 330 and 340 of the method 300, each LED die is tested for its forward voltage performance, and the results are recorded. Next, the tested LED dies are sorted according to their forward voltage performance. Then, during step 360, the LED dies are matched with other LED dies according to their respective forward voltage performances so that the total forward voltage of each LED string is matched to the other strings, resulting in balanced current through each string. This matching allows for a higher yield in usable LED dies since the matched LED dies compensate for the forward voltage performance of the other LED dies, even if the performance of the individual LED dies fall outside the narrow specification traditionally used.

For example, where the ideal forward voltage for each six-LED string is 12V with an acceptable specification of +/−0.6V, the ideal forward voltage per LED is 2V with an acceptable range of +/−0.1V. Traditionally, any LED performing outside this +/−0.1V range may be discarded. However, maintaining the 12V+/−0.6V per string specification of this example, the present invention prevents LED dies performing outside the specified range of 2V+/−0.1V from being discarded. If the production LED dies include LED dies having forward voltages of 2.3V, 1.7V, 2.2V, 1.8V, 2.0V and 2.2V, these LED dies are combined to form a string that would be within the specification for the entire string with a total forward voltage of 12.2V. However, applying the traditional method would have required that the 2.3V, 1.7V, 1.8V and both 2.2V LED dies be discarded since they perform outside the specification range of 2V+/−0.1V. Accordingly, the present invention allows more LED dies of a production batch to be utilized, resulting in a higher yield and reduced overall costs.

In another alternative embodiment, total luminous flux of the strings may be the parameter selected. The method for optimizing the yield for manufacturing LED array 800 for total luminous flux is similar to that described with respect to forward voltage, except the testing, recording, and matching are performed utilizing total luminous flux measurements instead of forward voltage.

It is understood that the above-described embodiments are illustrative of only a few of the many possible specific embodiments, which can represent applications of the invention. Numerous and varied other arrangements can be made by those skilled in the art without departing from the spirit and scope of the invention.

The invention claimed is:

1. A method of selecting individual lighting elements to be used in an array of lighting elements, comprising:
    selecting a parameter of the array of lighting elements to optimize;
    testing the individual lighting elements in a production batch available for a manufacture of the array of lighting elements to characterize a performance of the individual lighting elements for the selected parameter by a performance distribution curve for the selected parameter;
    establishing two or more sub-ranges for the performance of the individual lighting elements for the selected parameter, each sub-range being a subset of the performance distribution curve for the selected parameter;
    associating each of the individual lighting elements with one of said sub-ranges based on the performance of each individual lighting element for the selected parameter; and
    matching an individual lighting element from a first of said sub-ranges based on its performance for the selected parameter with a lighting element from a second of said sub-ranges based on its performance for the selected parameter, wherein the first of said sub-ranges is a first subset of the performance distribution curve for the selected parameter and the second of said sub-ranges is a second subset of the performance distribution curve for the selected parameter, and the second subset is substantially non-overlapping with the first subset; and
    manufacturing a light from the array of lighting elements using the matched individual lighting elements.

2. The method of claim 1, wherein each of the individual lighting elements comprises a light emitting diode ("LED").

3. The method of claim 1, wherein the array of lighting elements comprises two or more strings of individual lighting elements.

4. The method of claim 3, wherein the step of matching individual lighting elements comprises selecting individual lighting elements so that when combined in strings of individual lighting elements, each of the strings has matched performance values for the selected parameter.

5. The method of claim 1, wherein the selected parameter comprises dominant wavelength.

6. The method of claim 1, wherein the selected parameter comprises peak wavelength.

7. The method of claim 1, wherein the selected parameter comprises forward voltage.

8. The method of claim 1, wherein the selected parameter comprises color rendering index ("CRI").

9. The method of claim 1, wherein the selected parameter comprises uniform light output.

10. The method of claim 1, wherein the selected parameter comprises total luminous flux.

11. The method of claim 1, wherein the step of matching individual lighting elements comprises selecting individual lighting elements that have complementary performance for the selected parameter.

* * * * *